US009416921B2

(12) United States Patent
Fiene et al.

(10) Patent No.: US 9,416,921 B2
(45) Date of Patent: Aug. 16, 2016

(54) VAPOR LAMP ASSEMBLY TECHNIQUE

(76) Inventors: Dale Fiene, Algonquin, IL (US); Ole Nilssen, Barrington, IL (US)

( * ) Notice: Subject to any disclaimer, the term of this patent is extended or adjusted under 35 U.S.C. 154(b) by 917 days.

(21) Appl. No.: 13/473,253

(22) Filed: May 16, 2012

(65) Prior Publication Data

US 2012/0291269 A1 Nov. 22, 2012

Related U.S. Application Data

(60) Provisional application No. 61/486,582, filed on May 16, 2011.

(51) Int. Cl.

| | |
|---|---|
| ***H05K 3/30*** | (2006.01) |
| ***F21K 99/00*** | (2016.01) |
| ***F21V 29/00*** | (2015.01) |
| ***F21V 3/04*** | (2006.01) |
| ***H05B 33/08*** | (2006.01) |
| *F21Y 101/02* | (2006.01) |
| *F21Y 111/00* | (2016.01) |
| *F21V 29/506* | (2015.01) |

(52) U.S. Cl.

CPC . *F21K 9/135* (2013.01); *F21K 9/90* (2013.01); *F21V 3/0418* (2013.01); *F21V 29/20* (2013.01); *H05B 33/0803* (2013.01); *H05B 33/0815* (2013.01); *F21V 29/006* (2013.01); *F21V 29/506* (2013.01); *F21Y 2101/02* (2013.01); *F21Y 2111/005* (2013.01); *Y10T 29/49117* (2015.01)

(58) Field of Classification Search

CPC ..... F21V 29/20; F21V 3/0418; F21V 29/006; F21V 29/506; F21K 9/135; F21K 9/90; H05B 33/0815; H05B 33/0803; F21Y 2101/02; F21Y 2111/005; Y10T 29/49117; Y10T 29/4913

USPC ......... 29/830–832; 315/32, 35; 362/294, 545, 362/547, 800; 445/38, 42, 44

See application file for complete search history.

(56) References Cited

U.S. PATENT DOCUMENTS

| | | | | |
|---|---|---|---|---|
| 6,634,771 | B2 * | 10/2003 | Cao | F21K 9/135 362/294 |
| 8,366,503 | B2 * | 2/2013 | Chiang | F21K 9/135 445/42 |
| 2011/0193479 | A1 * | 8/2011 | Nilssen | F21V 29/006 315/35 |

* cited by examiner

*Primary Examiner* — Donghai D Nguyen

(74) *Attorney, Agent, or Firm* — Clifford Kraft

(57) ABSTRACT

An LED lamp that couples a heatsink with LEDs mounted on it to a glass envelope with a surface area equivalent to approximately that of a conventional light bulb, and by using a coolant vapor within the glass envelop, the lamp can be made much lighter and more cheaply. The heat generated by the LEDs is dissipated by the glass surface and not conducted into the heatsink. The heatsink can thus be mostly for the power supply. This allows for a reduced operating temperature for the power supply components that allows for a longer expected life for the power supply. In addition, the LED light bulb of the present invention can have nearly the same shape and appearance as a standard incandescent bulb. The invention can also have an advanced flyback power supply.

9 Claims, 6 Drawing Sheets

FIG. 5A
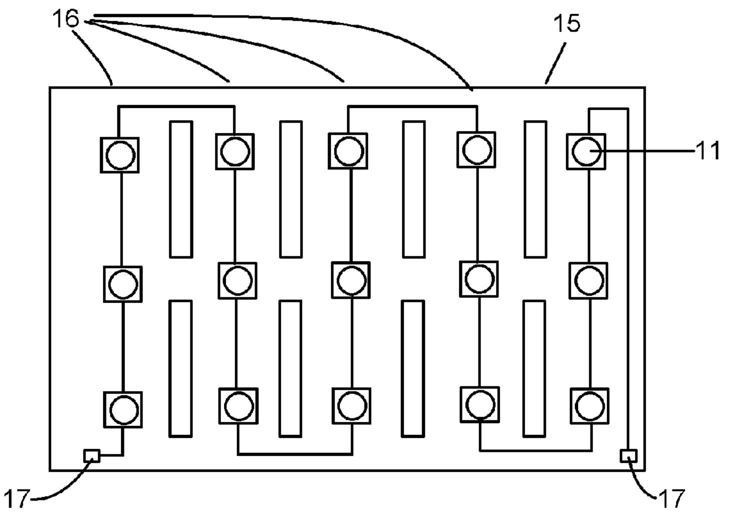
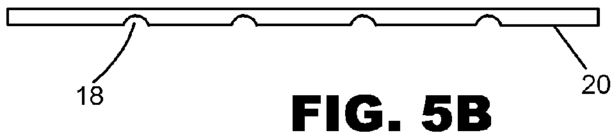
FIG. 5B

VAPOR LAMP ASSEMBLY TECHNIQUE

The present invention is related to, and claims priority to, U.S. Provisional Patent application No. 61/486,582 filed May 16, 2011. Application Ser. No. 61/486,582 is hereby incorporated by reference.

BACKGROUND

1. Field of the Invention

The present invention relates generally to the field of LED lamps and more particularly to a vapor lamp assembly technique and power supply.

2. Description of the Prior Art

LED (Light Emitting Diode) lamps currently on the market usually consist of a fairly heavy aluminum base that incorporates a power supply and has LEDs mounted onto it (such as shown in FIG. 1). The aluminum therefore is providing the heat sink for the power supply and also the LEDs. This generally results in a lamp that weighs 5 or 6 ounces due to the amount of aluminum used for the heatsink even for a lamp that only replaces a 40 watt incandescent lamp.

A totally different type of LED lamp which is a vapor cooled LED lamp has been described in a sister application having U.S. Published Patent Application Number 2011/0193479 naming the present inventors (which is U.S. application Ser. No. 13/020,909 filed Feb. 4, 2011—application Ser. No. 13/020,909 is hereby incorporated by reference).

It would be advantageous to have a way of assembling a vapor cooled LED lamp that uses existing designs for incandescent bulb manufacturing equipment with only minor modifications, and has an efficient, advanced power supply.

SUMMARY OF THE INVENTION

The present invention relates to a new type of LED lamp, a vapor cooled LED lamp. The vapor cooled LED lamp couples a heatsink with LEDs mounted on it to a glass envelope with a surface area equivalent to approximately that of a conventional light bulb, and by using a coolant vapor within the glass envelop, the lamp can be made much lighter and more cheaply. The heat generated by the LEDs is dissipated primarily by the glass surface and not conducted into the heatsink. The heatsink can thus be made considerably smaller since it is mostly only used for cooling the power supply. This allows for a reduced operating temperature for the power supply components that will allow for a longer expected life for the power supply. In addition, the light bulb of the present invention can have the same shape and appearance as a standard incandescent bulb which has been in use for over 100 years. In addition, the LED lamp of the present invention can have an advanced flyback power supply.

DESCRIPTION OF THE FIGURES

Attention is now directed to several drawings that illustrate features of the present invention:

FIGS. 5A-5B show use of a grooved substrate.

Several drawings and illustrations have been presented to aid in understanding the invention. The scope of the present invention is not limited to what is shown in the figures.

DETAILED DESCRIPTION

The present invention relates to assembling a new type of vapor cooled LED lamp having a heatsink with LEDs mounted on it in a glass envelope with a surface area equivalent to approximately that of a conventional light bulb. The lamp is cooled by the vapor of a coolant within the glass envelope (described in U.S. 2011/0193479). The heat generated by the LEDs is dissipated by the glass surface and not conducted into the heatsink that is also the heatsink for the power supply. This construction permits the lamp to be either omni-directional or directional.

A power supply that converts AC voltage from the power lines to a DC current suitable for powering LEDs can be incorporated into the base of the lamp assembly. This is useful for a fixed voltage source such as the AC house mains.

Figure 1:
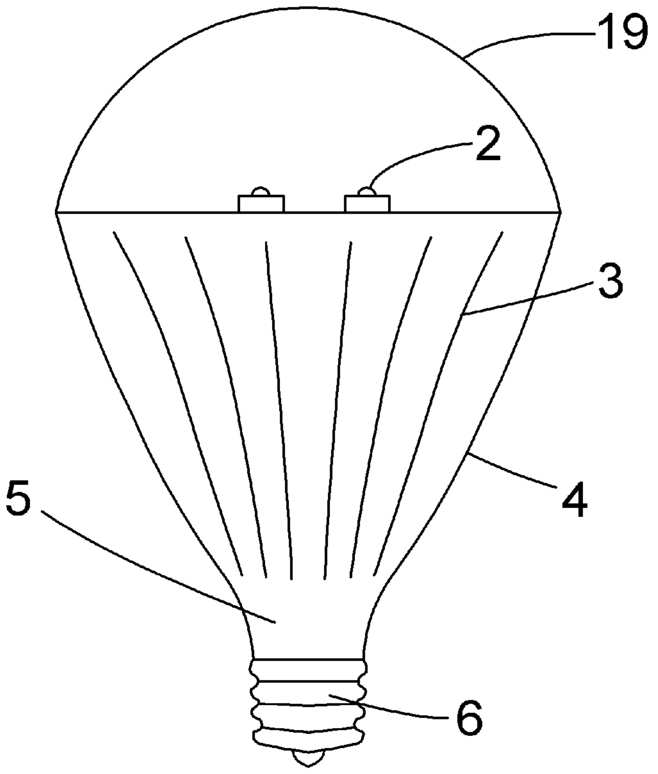
FIG. 1 shows a prior art LED lamp.

FIG. 1 shows a prior art LED lamp. The lamp has a defusing cover 19, and internal LEDs 2, cooling fins 3 that are part of an aluminum heat sink 4, an internally mounted power supply 5 and an Edison base 6. The heat sink 4 is large and heavy since it must dissipate both the heat from the power supply and the heat from the LEDs 2.

Figure 2:
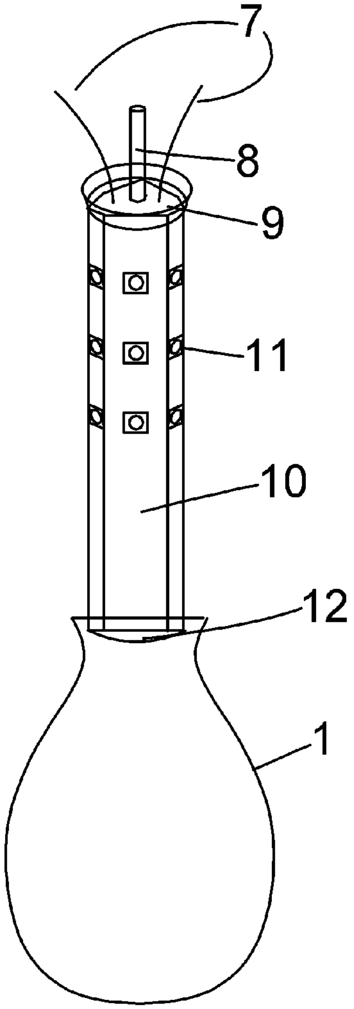
FIG. 2 shows an LED mount that inserts into a glass bulb.
Figure 3:
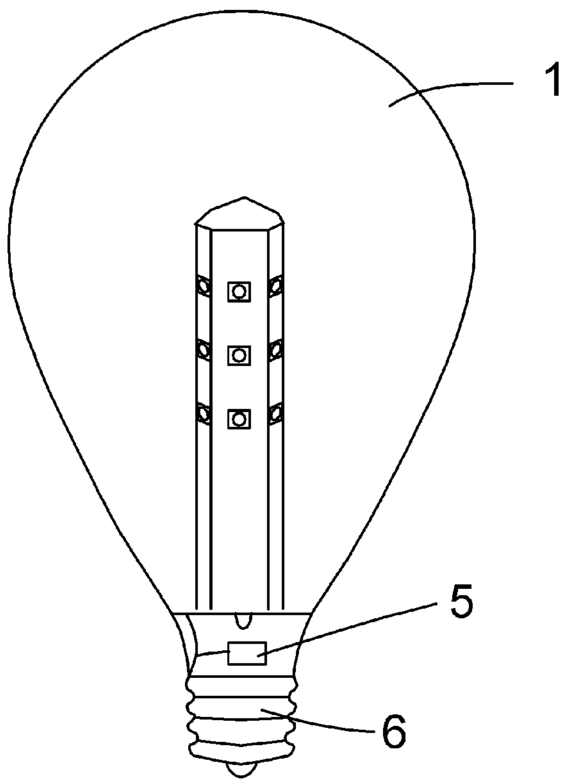
FIG. 3 shows an LED lamp of the present invention in an Edison base.

FIGS. 2-3 show an embodiment of a vapor cooled LED lamp. A first aspect of the present invention is to provide a cost effective way to assemble LED light bulbs, such as the bulb shown in FIG. 3, using a process that takes advantage of assembly equipment designs (with some modification) for the assembly of incandescent light bulbs. Using these existing, highly automated processes can significantly reduce the cost of the manufacturing process and provide a use for these, soon to be obsolete, equipment designs.

FIG. 2 shows an exploded view of an embodiment of the LED lamp of the present invention. A bulb 1 is a glass envelope. LEDs 11 are mounted on a thermally conducting structure 10 or internal stem. An optional wick 12 can be used to draw cooling fluid up into the bulb from an optional reservoir. The thermal structure 10 can have an optional glass base 9 to make it compatible with the incandescent manufacturing process. An evacuation tube 8 allows cooling fluid to be injected and/or air to be drawn out. Optionally, other gasses can be injected into the bulb. Electrical leads 7 lead to a DC power supply. The lamp can be assembled using almost the same type of tooling as that used to assemble conventional incandescent lamps. FIG. 3 shows a finished lamp assembled according to the present invention. It resembles a classical incandescent lamp. The glass bulb 1 can be identical to that of a conventional lamp. The LED power supply 5 can be mounted internally in and above the standard Edison base 6. The primary difference in the assembly process for the present invention over that of a conventional incandescent lamp is the injection of a small amount of cooling liquid or vapor into the lamp (the fluid will vaporize when heated). As stated, gases such as nitrogen, noble gases and other gases may also optionally be injected. The LEDs are mounted on the thermally conductive structure which can be fabricated separately for insertion during the manufacturing process.

Because the LED light bulb of the present invention typically includes an Edison base, a glass bulb and a glass or other base or stem just like a conventional light bulb. The LED light bulb can be assembled using the same manufacturing equipment used to manufacture incandescent light bulbs. Namely, the stem is mounted and electrically connected to the base; the bulb is sealed over the stem and base, and the bulb is evacuated through an evacuation tube. The LED light bulb additionally requires a power supply mounted in or above the base, and the injection of a small amount of cooling fluid. These additional steps require only minimal modifications to the existing manufacturing equipment designs.

Figure 4:
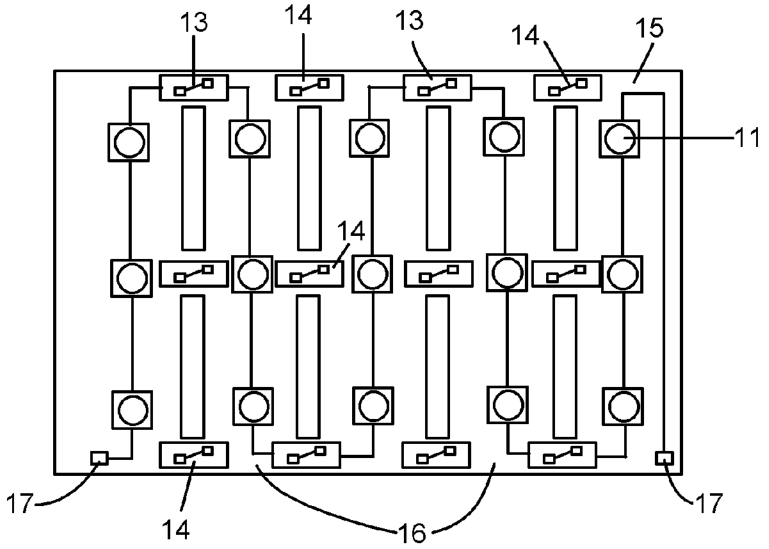
FIG. 4 shows a way of mounting and soldering LEDs to a thermally conductive substrate.

A second aspect of the present invention, illustrated in FIG. 4, is to provide a way of mounting and soldering the LEDs 11 to a thermally conductive substrate panel 15 that can be flat, and then bending that substrate to form a hollow cylinder-like structure with three or more segments or sides 16. The substrate may be a common printed circuit board, in which case, jumpers 13, 14 can be added before bending to hold the segments together, or the substrate can be metal such as aluminum. Some of the jumpers may be used to provide electrical connections 13 and others may be used to mechanically bind the segments together 14. This would be used in the case where an epoxy based printed circuit board is used, and the board could break and lose continuity, or if bending the aluminum tends to break the printed circuit path at the point of bending. Electrical connections 17 can lead away from the substrate 15 to a DC power supply in the base.

In the case of a metal substrate 15 as shown in FIGS. 5A-5B, the side 20 of the panel that does not have LEDs 11 mounted on it can be scored with one or more grooves 18 to facilitate bending and to control the line at which the bending occurs. In the case of either a metal substrate, or a common printed circuit board, holes or slots may be provided to facilitate bending or breaking along a specific line.

Figure 6:
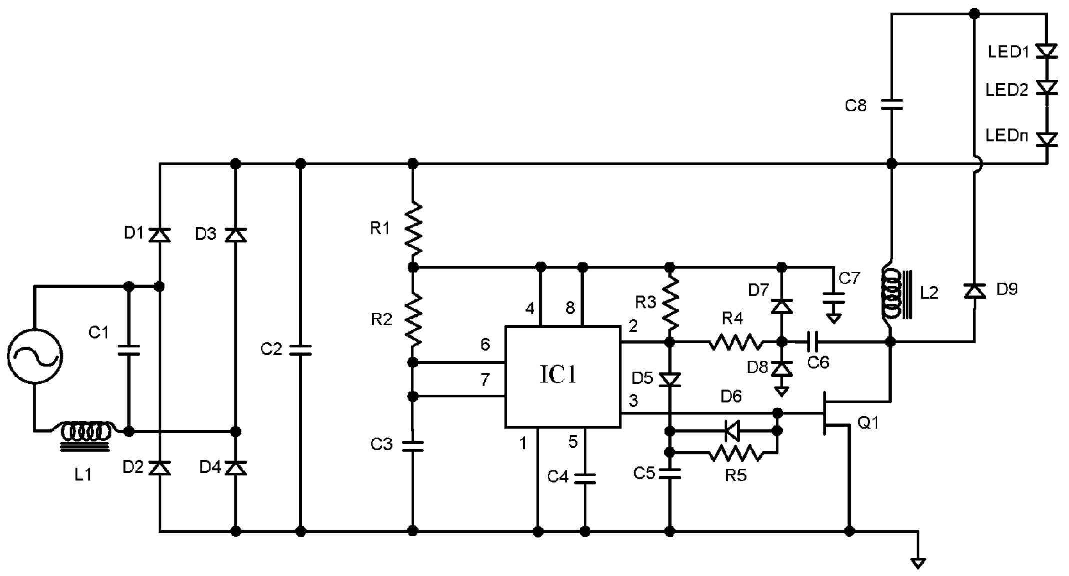
FIG. 6 shows an advanced flyback power supply circuit according to the present invention.

A final aspect of the present invention, illustrated in FIG. 6, is to provide a power supply circuit adapted to driving LEDs. When LED lamps are intended to replace incandescent light bulbs, even with the LEDs are connected in series, the total forward voltage drop is substantially less than the peak voltage value of the AC power line. Power supply topologies commonly used in the art for this purpose are the buck converter and the flyback converter using an isolated winding on the inductor to step-down the voltage. The present invention provides an alternative solution in situations where isolation is not required. This is accomplished by referencing the low or return side of the DC output voltage to the positive rail of the bridge rectifier. This eliminates the requirement that the minimum DC output voltage be greater than the maximum peak AC line voltage that exists with common non-isolated or non-tapped flyback converters.

Another feature of the topology of the present invention, which can be seen in FIG. 6, is that a capacitor can be used to signal when the stored energy of the flyback inductor has been transferred to the output load (which may or may not include a capacitor). When the energy transfer from the flyback inductor is complete, the voltage across transistor Q1 begins to drop. This drop in voltage is fed through capacitor C6 pulling pin 2 of IC1 low. IC1 can be a TLC555 circuit or equivalent. This causes pin 3 to go high turning on transistor Q1 and starting a new cycle which pulls current through L2 and through the transistor Q1. When C3 charges to two thirds of the TLC555's supply voltage, pin 3 goes low turning off Q1 and Q1's drain goes high. When this occurs, the charge on capacitor C6 is transferred to capacitor C7 to supply the DC voltage required by the control circuit. C8 can be varied to control the ripple of the voltage applied to the LEDs. In some embodiments, C8 can be omitted.

The following component values may be used in a particular example embodiment of the power supply of the present invention:

| | |
|---|---|
| IC1 | TLC555 |
| D1-D4 | 1N4004 |
| D5, D6, D8 | 1N4148 |
| D7, D9 | 1N4937 |
| Q1 | IR9525 |
| L1 | 0.15 mH |
| L2 | 0.4 mH |
| R1 | 91K |
| R2 | 7.5K |
| R3 | 100K |
| R4 | 1K |
| R5 | 22K |
| C1 | .0047 uF |
| C2 | .1 uF |
| C3 | 220 pF |
| C4 | 330 pF |
| C5 | .0047 uF |
| C6 | 39 pF |
| C7 | 4.7 uF |
| C8 | 0 uF to 150 uf (0 uF meaning omitted) |
| LEDs | CREE XPGWHT-L1 |

While particular component values have been given for this example, numerous other values and/or variations in these values can be used. The circuit shown in FIG. 6, and the list of components above is simply for example. Numerous other circuits and component values are within the scope of the present invention.

The present invention provides a convenient solution to the problem of assembling and manufacturing LED lamps using techniques and equipment conventionally used for the manufacture of incandescent light bulbs. The solution includes a unique type of thermal mounting structure and a unique, efficient power supply.

Several descriptions and figures have been provided to aid in understanding the present invention. One with skill in the art will realize that numerous changes and variations may be made without departing from the spirit of the invention. Each of these changes and variations is within the scope of the present invention.

We claim:

1. A method for assembling an Light Emitting Diode (LED) light bulb comprising: mounting LEDs onto a thermally conductive structure; mechanically incorporating the thermally conductive structure with a glass base; electrically connecting the LEDs with conductors incorporated within the glass base; fusing a glass envelope to the glass base via a heat source; injecting a coolant into the glass envelope via a tube; reducing the pressure within the glass envelope; and sealing off the tube.

2. The method of claim 1 further comprising adding a power supply capable of converting alternating current to direct current.

3. The method of claim 1 further comprising constructing said thermally conductive structure by: mounting LEDs onto a printed circuit panel; soldering or bonding to make electrical contact between the LEDs and the printed circuit; bending the printed circuit panel such that the LEDs are located on an outer surface.

4. The method of claim 3 further comprising providing at least one relief groove on the printed circuit panel to facilitate bending.

5. The method of claim 4 further comprising adding at least one jumper wire between segments of the printed circuit panel to hold the segments together after bending.

6. The method of claim 4 wherein said groove is on the backside of the circuit panel.

7. The method of claim 6 further comprising providing said LED light bulb with an Edison base.

8. The method of claim 7 wherein said power supply is a non-isolated flyback converter having a DC output voltage magnitude that is less than the maximum peak input voltage.

9. The method of claim 8 wherein said flyback converter is pseudo-discontinuous using a capacitor to sense the end of a discharge phase of an inductor.

* * * * *